US012721047B2

(12) United States Patent
Shirotori et al.

(10) Patent No.: US 12,721,047 B2
(45) Date of Patent: Aug. 25, 2026

(54) MAGNETIC SENSOR, MAGNETIC HEAD AND MAGNETIC RECORDING DEVICE

(71) Applicant: KABUSHIKI KAISHA TOSHIBA, Tokyo (JP)

(72) Inventors: Satoshi Shirotori, Yokohama Kanagawa (JP); Junki Numata, Kawasaki Kanagawa (JP); Kenichiro Yamada, Minato Tokyo (JP); Yoshihiro Higashi, Komatsu Ishikawa (JP); Akira Kikitsu, Yokohama Kanagawa (JP); Yoshinari Kurosaki, Kawasaki Kanagawa (JP)

(73) Assignee: KABUSHIKI KAISHA TOSHIBA, Kawasaki (JP)

(*) Notice: Subject to any disclaimer, the term of this patent is extended or adjusted under 35 U.S.C. 154(b) by 0 days.

(21) Appl. No.: 19/246,485

(22) Filed: Jun. 23, 2025

(65) Prior Publication Data

US 2026/0107690 A1 Apr. 16, 2026

(30) Foreign Application Priority Data

Oct. 16, 2024 (JP) ................................ 2024-180979

(51) Int. Cl.
*G11B 5/39* (2006.01)
*G11B 5/11* (2006.01)
*H10N 50/20* (2023.01)

(52) U.S. Cl.
CPC ............... *H10N 50/20* (2023.02); *G11B 5/11* (2013.01)

(58) Field of Classification Search
CPC ......... G11B 5/11; G11B 5/1272; G11B 5/374; G11B 5/3912; G11B 5/398; G11B 5/486; G11B 5/315; G11B 5/1278; G11B 5/3133; G11B 5/3146; G11B 5/3909; G11B 2005/0024; G11B 5/3109; G11B 5/35
USPC ........................................................ 360/59
See application file for complete search history.

(56) References Cited

U.S. PATENT DOCUMENTS 6,839,202 B2 * 1/2005 Zhou ...................... G11B 5/486
7,576,948 B2 8/2009 Covington et al.
2024/0135967 A1 4/2024 Nagasawa et al.

FOREIGN PATENT DOCUMENTS

JP 2024-61372 A 5/2024

* cited by examiner

*Primary Examiner* — Nabil Z Hindi
(74) *Attorney, Agent, or Firm* — Finnegan, Henderson, Farabow, Garrett & Dunner, LLP

(57) ABSTRACT

According to one embodiment, a magnetic sensor includes a detection section including first to fourth shields, a first magnetic member, first to fourth conductive members being non-magnetic. A second direction from the third shield to the fourth shield crosses a first direction from the first shield to the second shield. The first magnetic member is provided between the first shield and the second shield and between the third shield and the fourth shield. The first to fourth conductive members, satisfy one of first to fourth conditions regarding first to third materials. The first material includes at least one selected from the group consisting of Nb, Mo, Tc, Ta, W, and Re. The second material includes at least one selected from the group consisting of Ru, Rh, Pd, Os, Ir, and Pt. The third material includes at least one selected from the group consisting of Cu, Al, Tb, and Cr.

20 Claims, 7 Drawing Sheets

41
31
42
70A
70x
25
11
21
22
Z
D3
D2
Y
D1
X
41F

MAGNETIC SENSOR, MAGNETIC HEAD AND MAGNETIC RECORDING DEVICE

CROSS-REFERENCE TO RELATED APPLICATIONS

This application is based upon and claims the benefit of priority from Japanese Patent Application No. 2024-180979, filed on Oct. 16, 2024; the entire contents of which are incorporated herein by reference.

FIELD

Embodiments described herein relate generally to a magnetic sensor, a magnetic head, and a magnetic recording device.

BACKGROUND

Information recorded on a magnetic recording medium is reproduced by using a magnetic head that uses a magnetic sensor including a magnetic layer. It is desirable to improve the characteristics of the magnetic sensor.

DETAILED DESCRIPTION

Figures 1A, 1B:
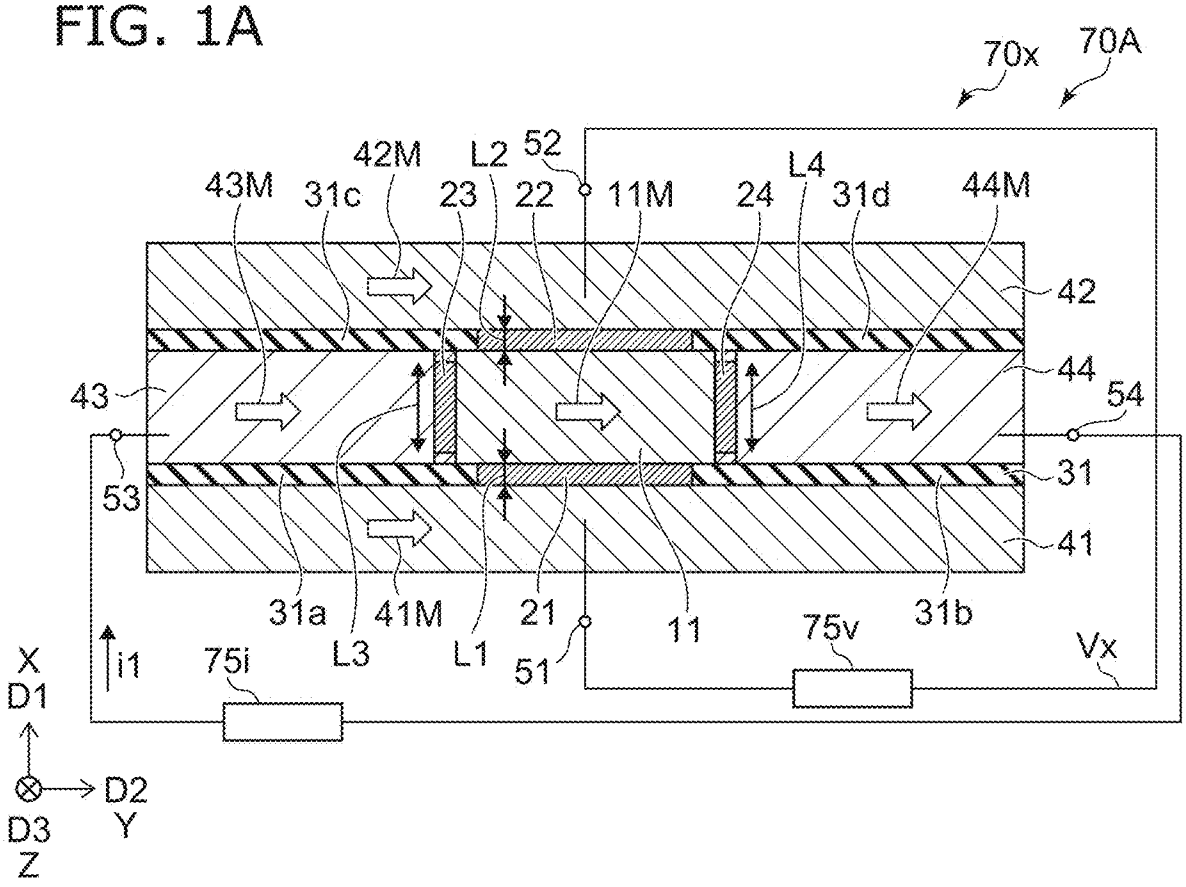
FIGS. 1A and 1B are schematic cross-sectional views illustrating a magnetic sensor according to a first embodiment.

According to one embodiment, a magnetic sensor includes a detection section. The detection section includes a first shield, a second shield, a third shield, a fourth shield, a first magnetic member, a first conductive member being non-magnetic, a second conductive member being non-magnetic, a third conductive member being non-magnetic, and a fourth conductive member being non-magnetic. A second direction from the third shield to the fourth shield crosses a first direction from the first shield to the second shield. The first magnetic member is provided between the first shield and the second shield and between the third shield and the fourth shield. The first conductive member is provided between the first shield and the first magnetic member. The second conductive member is provided between the second shield and the first magnetic member. The third conductive member is provided between the third shield and the first magnetic member. The fourth conductive member provided between the fourth shield and the first magnetic member. The first conductive member, the second conductive member, the third conductive member, and the fourth conductive member satisfy one of a first condition, a second condition, a third condition, and a fourth condition. In the first condition, one of the first conductive member, the second conductive member, the third conductive member, and the fourth conductive member includes one of a first material and a second material, and other three of the first conductive member, the second conductive member, the third conductive member, and the fourth conductive member include a third material. In the second condition, the first conductive member and the second conductive member include the one of the first material and the second material, and the third conductive member and the fourth conductive member including the third material. In the third condition, the third conductive member and the fourth conductive member including the one of the first material and the second material, and the first conductive member and the second conductive member including the third material. In the fourth condition, three of the first conductive member, the second conductive member, the third conductive member, and the fourth conductive member including the one of the first material and the second material, and other one of the first conductive member, the second conductive member, the third conductive member, and the fourth conductive member including the third material. The first material includes at least one selected from the group consisting of Nb, Mo, Tc, Ta, W, and Re. The second material includes at least one selected from the group consisting of Ru, Rh, Pd, Os, Ir, and Pt. The third material includes at least one selected from the group consisting of Cu, Al, Tb, and Cr.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIGS. 1A and 1B are schematic cross-sectional views illustrating a magnetic sensor according to the first embodiment.

As shown in FIG. 1A, a magnetic sensor 70A according to the embodiment includes a detection section 70*x*. The detection section 70*x* includes a first shield 41, a second shield 42, a third shield 43, a fourth shield 44, a first magnetic member 11, a first conductive member 21, a second conductive member 22, a third conductive member 23, and a fourth conductive member 24. FIG. 1B corresponds to a cross-sectional view in a plane including the first shield 41, the first magnetic member 11, and the second shield 42.

A second direction D2 from the third shield 43 to the fourth shield 44 crosses a first direction D1 from the first shield 41 to the second shield 42.

One direction perpendicular to a Z-axis direction is defined as an X-axis direction. A direction perpendicular to the Z-axis and X-axis directions is defined as a Y-axis direction. In the examples of FIGS. 1A and 1B, the first direction D1 may be the X-axis direction. The second direction D2 may be the Y-axis direction.

The first magnetic member 11 is provided between the first shield 41 and the second shield 42, and between the third shield 43 and the fourth shield 44.

The first conductive member 21 is provided between the first shield 41 and the first magnetic member 11, and is non-magnetic. The second conductive member 22 is provided between the second shield 42 and the first magnetic member 11, and is non-magnetic. The third conductive member 23 is provided between the third shield 43 and the first magnetic member 11, and is non-magnetic. The fourth conductive member 24 is provided between the fourth shield 44 and the first magnetic member 11, and is non-magnetic.

In the embodiment, the first conductive member 21, the second conductive member 22, the third conductive member 23 and the fourth conductive member 24 satisfy one of a first condition, a second condition, a third condition and a fourth condition.

In the first condition, one of the first conductive member 21, the second conductive member 22, the third conductive member 23, and the fourth conductive member 24 includes one of the first material and the second material. Other three of the first conductive member 21, the second conductive member 22, the third conductive member 23, and the fourth conductive member 24 include a third material.

The first material includes at least one selected from the group consisting of Nb, Mo, Tc, Ta, W, and Re. The second material includes at least one selected from the group consisting of Ru, Rh, Pd, Os, Ir, and Pt. The third material includes at least one selected from the group consisting of Cu, Al, Tb, and Cr.

In the second condition, the first conductive member 21 and the second conductive member 22 include one of the first material and the second material, and the third conductive member 23 and the fourth conductive member 24 include the third material.

In the third condition, the third conductive member 23 and the fourth conductive member 24 include one of the first material and the second material, and the first conductive member 21 and the second conductive member 22 include the third material.

In the fourth condition, three of the first conductive member 21, the second conductive member 22, the third conductive member 23, and the fourth conductive member 24 include one of the first material and the second material, and other one of the first conductive member 21, the second conductive member 22, the third conductive member 23, and the fourth conductive member 24 includes the third material.

In the detection section 70*x* as described above, for example, a first current i1 flows through the first magnetic member 11 via the first shield 41 and the second shield 42. In this state, when a detection target magnetic field is applied to the detection section 70*x*, a signal (voltage Vx) generated in the layered structure of the third shield 43, the first magnetic member 11, and the fourth shield 44 changes according to the detection target magnetic field. The detection target magnetic field can be detected by detecting the signal (voltage Vx). As described later, the first current i1 may flow through the first magnetic member 11 via the third shield 43 and the fourth shield 44, and a signal (voltage Vx) generated in the layered structure of the first shield 41, the first magnetic member 11, and the second shield 42 may be detected.

As described above, in the embodiment, the first conductive member 21, the second conductive member 22, the third conductive member 23, and the fourth conductive member 24 satisfy one of the first to fourth conditions described above. It has been found that under such conditions, a large signal (voltage Vx) can be obtained. By applying such materials, the detection target magnetic field can be detected with high sensitivity. The detection target magnetic field can be detected with high accuracy. A magnetic sensor can be provided that allows for improved characteristics.

For example, in the first material described above, a negative spin Hall angle with a large absolute value is obtained. For example, in the second material described above, a positive spin Hall angle with a large absolute value is obtained. It is considered that a large signal (voltage Vx) is obtained due to the action of the spins accumulated in the first conductive member 21, the second conductive member 22, the third conductive member 23, and the fourth conductive member 24 due to the large spin Hall angle, and the magnetization of the first magnetic member 11.

By selecting and applying one of the first and second materials, the signals generated between the first conductive member 21 and the first magnetic member 11, between the second conductive member 22 and the first magnetic member 11, between the third conductive member 23 and the first magnetic member 11, and between the fourth conductive member 24 and the first magnetic member 11 are coordinated, resulting in a large signal (voltage Vx).

In the third material, the spin Hall angle is small. Even when such a third material is combined with either the first material or the second material, the absolute value of the spin Hall angle is suppressed from becoming small. A large absolute value of the spin Hall angle is maintained overall.

Under the first to fourth conditions as described above, a large signal (voltage Vx) is obtained.

In the embodiment, the first magnetic member 11 may include at least one selected from the group consisting of Fe, Co, and Ni. With such a material, good crystallinity is easily obtained. This makes it easy to obtain stable characteristics. On the other hand, with such a material, the signal (voltage Vx) obtained when the first current i1 flows is relatively small. By combining the first magnetic member 11 including such a material with the above-mentioned conductive member (first material or second material), it is easy to obtain a large signal (voltage Vx) in a stable manner.

In a case where the first magnetic member 11 includes at least one selected from the group consisting of Fe, Co, and Ni, the first magnetic member 11 may further include B. The first magnetic member 11 includes, for example, CoFeB. This makes it easier to obtain a better quality crystal orientation.

In the embodiment, the first magnetic member 11 may have an anomalous Hall effect. It is easy to obtain a large signal (voltage Vx).

In the embodiment, the first magnetic member 11 may include at least one selected from the group consisting of $Co_2MnGa$, $Co_2MnAl$, FePt, MnGa, $Mn_3Sn$, $Mn_3Ge$, $Mn_3Ga$, $RuO_2$, MnTe, CrSb, and $Mn_5Si_3$. These materials can effectively obtain, for example, the anomalous Hall effect.

As shown in FIG. 1B, the first shield 41 includes a first end face 41F. A direction from the first magnetic member 11 to the fifth conductive member 25 is along a third direction D3. The third direction D3 crosses a plane including the first direction D1 and the second direction D2. The third direction D3 is, for example, the Z-axis direction. In a case where the magnetic sensor 70A is applied to a magnetic head, the first end face 41F may correspond to the medium-facing surface.

As shown in FIG. 1B, the detection section 70x may further include a fifth conductive member 25 being non-magnetic. A position (first position) of at least a part of the first magnetic member 11 in the third direction D3 is between a position (first end face position) of the first end face 41F in the third direction D3 and a position (fifth conductive member position) of the fifth conductive member 25 in the third direction D3.

For example, the fifth conductive member 25 may include one of the first material and the second material. A part of the current passing through the first magnetic member 11 may flow to the fifth conductive member 25. By the fifth conductive member 25 including the above material, spin accumulation is likely to be well maintained. A large signal (voltage Vx) is obtained by the action of the spins accumulated in the fifth conductive member 25 and the magnetization of the first magnetic member 11.

In the example of FIG. 1A, the third shield 43 is provided between a part of the first shield 41 and a part of the second shield 42 in the first direction D1. The fourth shield 44 is provided between another part of the first shield 41 and another part of the second shield 42 in the first direction D1.

As shown in FIG. 1A, a length of the first conductive member 21 along the first direction D1 is defined as a first conductive member length L1. It is preferable that the first conductive member length L1 is 4 nm or more. As a result, the spins accumulated in the opposite directions on the end face are not mixed and are easily accumulated. This increases the amount of spin accumulation, and a large signal (voltage Vx) can be obtained.

As shown in FIG. 1A, a length of the second conductive member 22 along the first direction D1 is defined as a second conductive member length L2. It is preferable that the second conductive member length L2 is 4 nm or more. As a result, the spins accumulated in the opposite directions on the end face are not mixed and are easily accumulated. This increases the amount of spin accumulation, and a large signal (voltage Vx) can be obtained.

As shown in FIG. 1A, a length of the third conductive member 23 along the first direction D1 is defined as a third conductive member length L3. It is preferable that the third conductive member length L3 is 4 nm or more. As a result, the spins accumulated in the opposite directions on the end face are not mixed and are easily accumulated. This increases the amount of spin accumulation, and a large signal (voltage Vx) can be obtained.

As shown in FIG. 1A, a length of the fourth conductive member 24 along the first direction D1 is defined as a fourth conductive member length L4. It is preferable that the fourth conductive member length L4 is 4 nm or more. As a result, the spins accumulated in the opposite directions on the end face are not mixed and are easily accumulated. This increases the amount of spin accumulation, and a large signal (voltage Vx) can be obtained.

As shown in FIG. 1A, in this example, the first shield magnetization 41M of the first shield 41 has an orientation from the third shield 43 to the fourth shield 44. The second shield magnetization 42M of the second shield 42 has the orientation from the third shield 43 to the fourth shield 44. The third shield magnetization 43M of the third shield 43 has the orientation from the third shield 43 to the fourth shield 44. The fourth shield magnetization 44M of the fourth shield 44 has an orientation from the third shield 43 to the fourth shield 44. The first magnetic member magnetization 11M of the first magnetic member 11 has the orientation from the third shield 43 to the fourth shield 44.

The detection section 70x may further include an insulating member 31. For example, the insulating member 31 may include a first insulating portion 31a, a second insulating portion 31b, a third insulating portion 31c, and a fourth insulating portion 31d. The first insulating portion 31a is provided between a part of the first shield 41 and the third shield 43. The second insulating portion 31b is provided between another part of the first shield 41 and the fourth shield 44. The third insulating portion 31c is provided between a part of the second shield 42 and the third shield 43. The fourth insulating portion 31d is provided between another part of the second shield 42 and the fourth shield 44.

As shown in FIG. 1A, a part of the insulating member 31 may be provided between the first shield 41 and the second shield 42.

As shown in FIG. 1A, the detection section 70x may include a first terminal 51, a second terminal 52, a third terminal 53, and a fourth terminal 54. The first terminal 51 is electrically connected to the first shield 41. The second terminal 52 is electrically connected to the second shield 42. The third terminal 53 is electrically connected to the third shield 43. The fourth terminal 54 is electrically connected to the fourth shield 44.

For example, a voltage detection circuit 75v may be connected between the first terminal 51 and the second terminal 52. A current supply circuit 75i may be connected between the third terminal 53 and the fourth terminal 54. The current supply circuit 75i is configured to supply a first current i1 through a current path including the third shield 43, the first magnetic member 11, and the fourth shield 44 via the third terminal 53 and the fourth terminal 54. The voltage detection circuit 75v is configured to detect an electrical signal (voltage Vx) generated between the first terminal 51 and the second terminal 52.

In this way, the detection section 70x may be configured such that the voltage Vx between the first terminal 51 and the second terminal 52 when the first current i1 flows between the third terminal 53 and the fourth terminal 54 changes according to the detection target magnetic field.

Figure 2A:
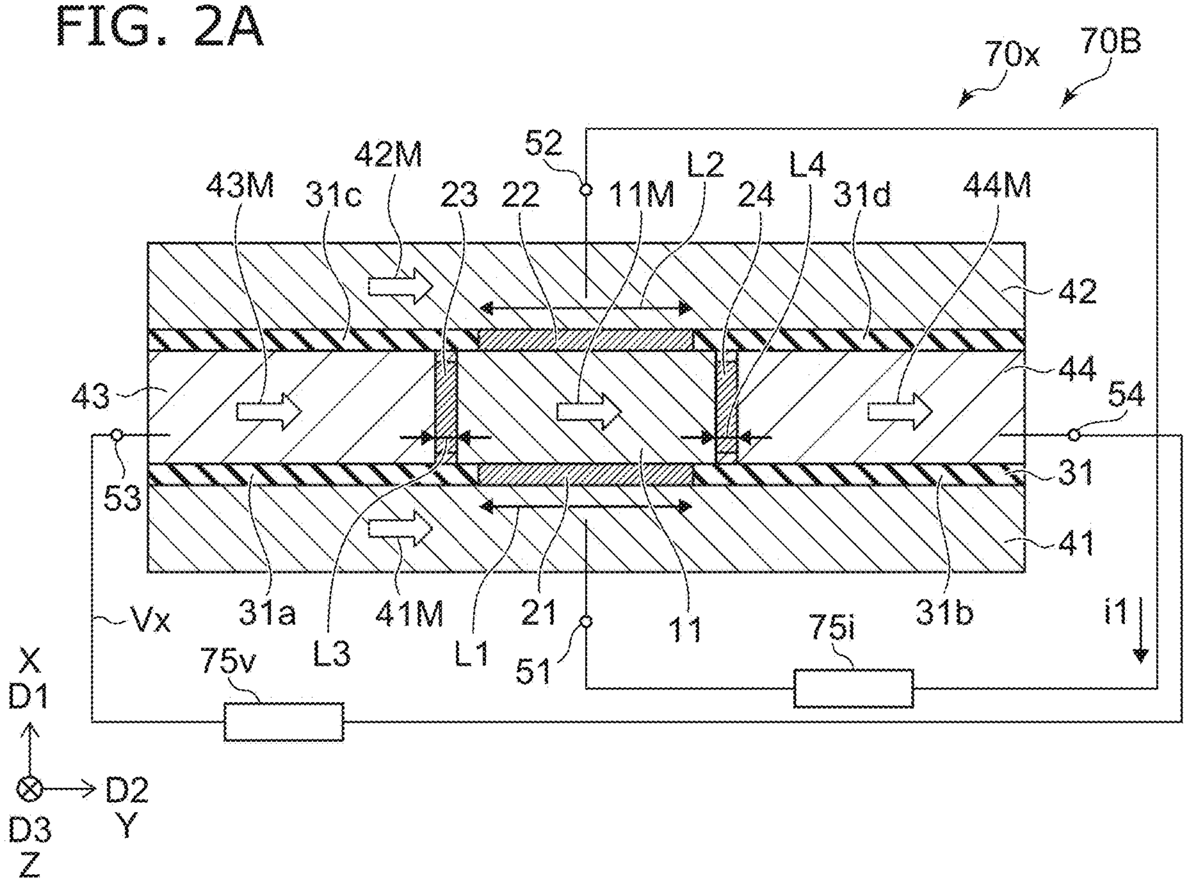
FIGS. 2A and 2B are schematic cross-sectional views illustrating a magnetic sensor according to the first embodiment.
Figure 2B:
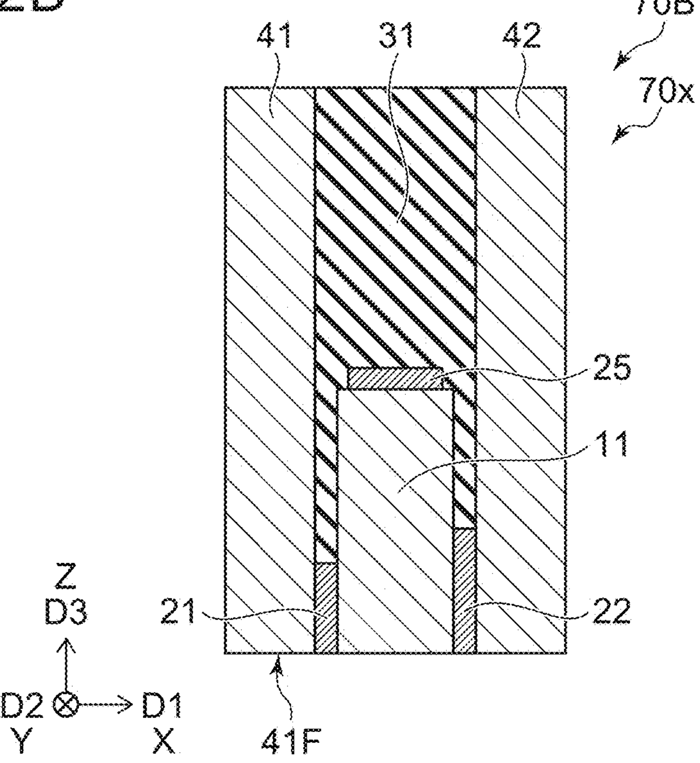

FIGS. 2A and 2B are schematic cross-sectional views illustrating a magnetic sensor according to the first embodiment.

As shown in FIG. 2A, in a magnetic sensor 70B according to the embodiment, the voltage detection circuit 75v is connected between the third terminal 53 and the fourth terminal 54, and the current supply circuit 75i is connected between the first terminal 51 and the second terminal 52. Except for this, the configuration of the magnetic sensor 70B may be the same as the configuration of the magnetic sensor 70A.

In the magnetic sensor 70B as well, by applying one of the first material and the second material described above, a large signal (voltage Vx) can be obtained. The first to fourth configurations may also be applied to the magnetic sensor 70B. In the magnetic sensor 70B, the detection section 70x may be configured such that the voltage Vx between the third terminal 53 and the fourth terminal 54 when the first current i1 flows between the first terminal 51 and the second terminal 52 changes according to the detection target magnetic field.

Figure 3A:
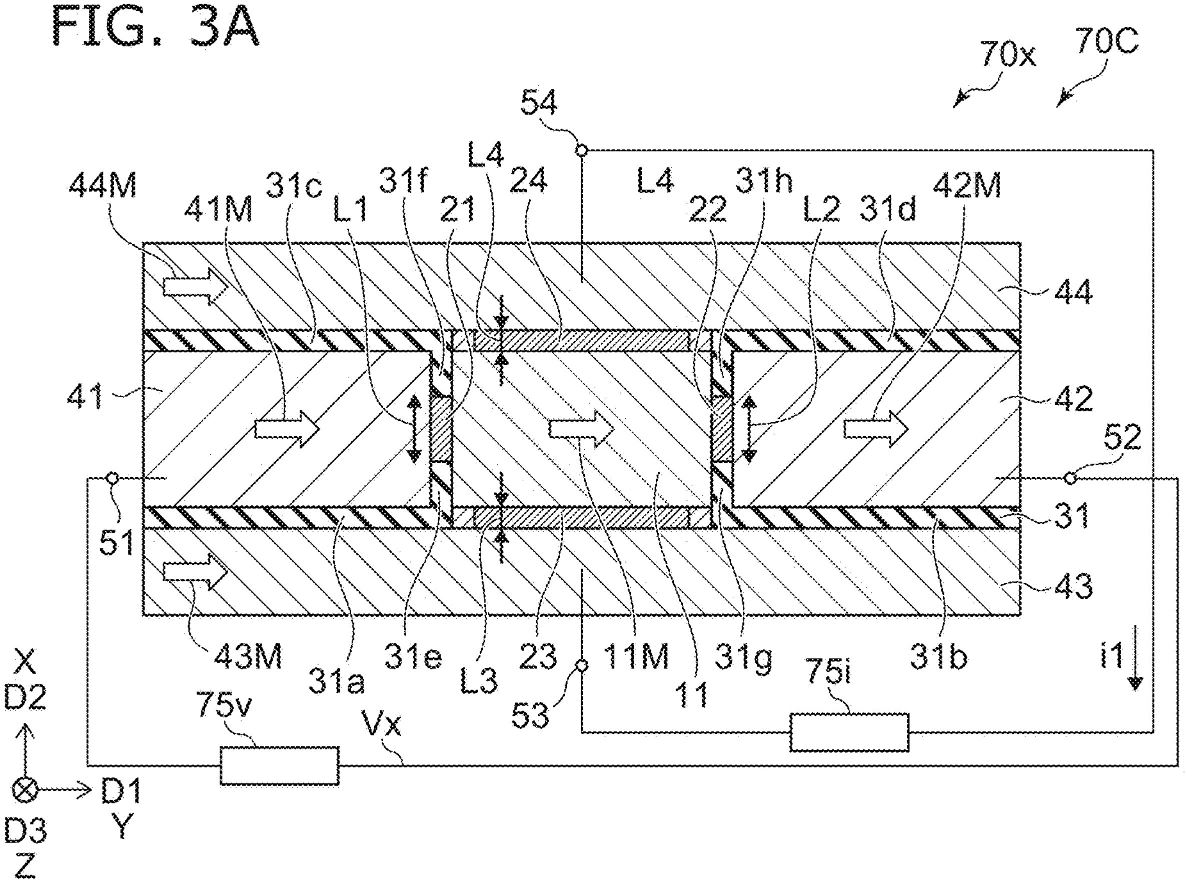
FIGS. 3A and 3B are schematic cross-sectional views illustrating a magnetic sensor according to the first embodiment.
Figure 3B:
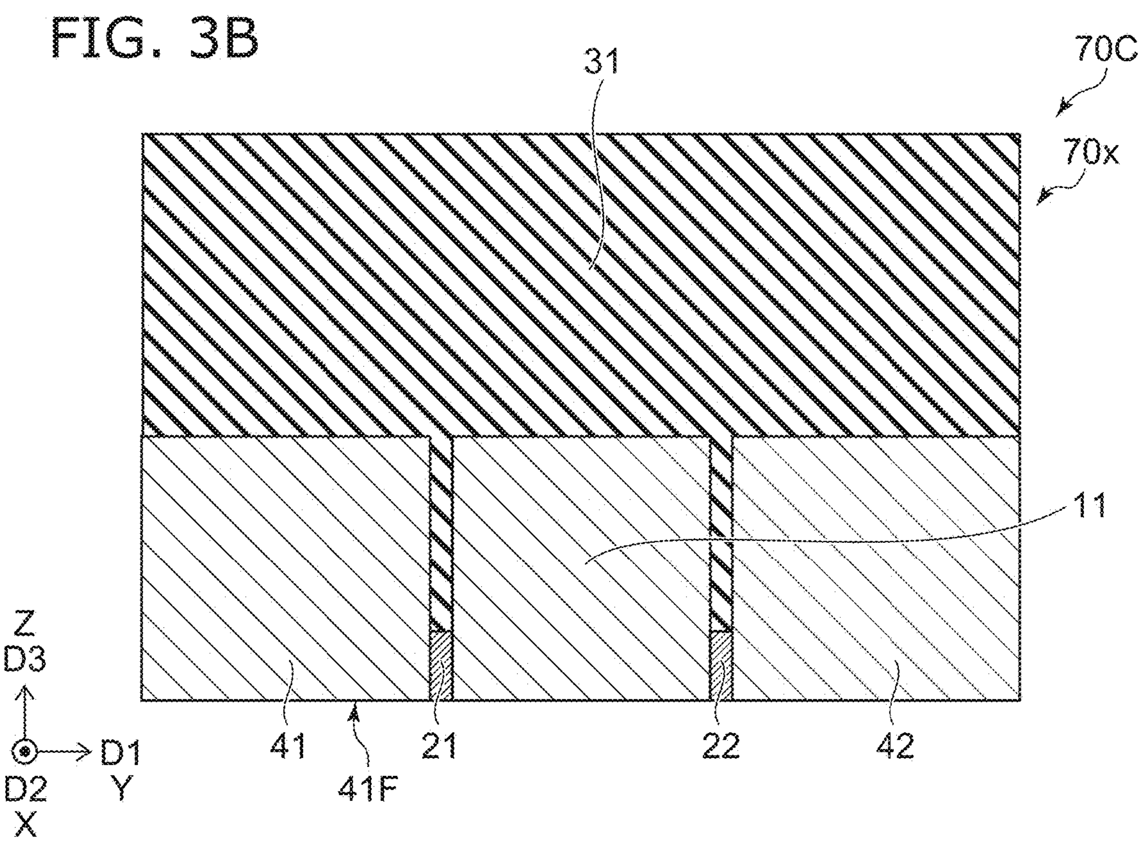

FIGS. 3A and 3B are schematic cross-sectional views illustrating a magnetic sensor according to the first embodiment.

As shown in FIG. 3A, in a magnetic sensor 70C according to the embodiment, the configuration of the plurality of shields is different from that in magnetic sensor 70A. Except for this, the configuration of magnetic sensor 70C may be the same as the configuration of the magnetic sensor 70A.

In the magnetic sensor 70C, the first shield 41 is provided between a part of the third shield 43 and a part of the fourth shield 44 in the first direction D1. The second shield 42 is provided between another part of the third shield 43 and another part of the fourth shield 44 in the first direction D1.

In this example, the first direction D1 may be along the Y-axis direction. The second direction D2 may be along the X-axis direction.

In the magnetic sensor 70C as well, by applying one of the first material and the second material described above, a large signal (voltage Vx) is obtained. In the magnetic sensor 70C as well, the first to fourth configurations may be applied.

In the magnetic sensor 70C, the voltage detection circuit 75*v* is connected between the first terminal 51 and the second terminal 52, and the current supply circuit 75*i* is connected between the third terminal 53 and the fourth terminal 54.

In the configuration of the magnetic sensor 70C, the length of third conductive member 23 along second direction D2 is defined as the third conductive member length L3. It is preferable that third conductive member length L3 is 4 nm or more. As a result, the spins accumulated in the opposite directions on the end face are not mixed and are easily accumulated. This increases the amount of spin accumulation, and a large signal (voltage Vx) can be obtained.

In the configuration of the magnetic sensor 70C, the length of fourth conductive member 24 along second direction D2 is defined as the fourth conductive member length L4. It is preferable that fourth conductive member length L4 is 4 nm or more. As a result, the spins accumulated in the opposite directions on the end face are not mixed and are easily accumulated. This increases the amount of spin accumulation, and a large signal (voltage Vx) can be obtained.

In the configuration of the magnetic sensor 70C, the length of first conductive member 21 along second direction D2 is defined as the first conductive member length L1. It is preferable that first conductive member length L1 is 4 nm or more. As a result, the spins accumulated in the opposite directions on the end face are not mixed and are easily accumulated. This increases the amount of spin accumulation, resulting in a large signal (voltage Vx).

In the configuration of the magnetic sensor 70C, the length of second conductive member 22 along second direction D2 is defined as the second conductive member length L2. It is preferable that the second conductive member length L2 is 4 nm or more. As a result, the spins accumulated in the opposite directions on the end face are not mixed and are easily accumulated. This increases the amount of spin accumulation, resulting in a large signal (voltage Vx).

As shown in FIG. 3*a*, in the magnetic sensor 70C, the insulating member 31 may include the first insulating portion 31*a*, the second insulating portion 31*b*, the third insulating portion 31*c*, and the fourth insulating portion 31*d*. The first insulating portion 31*a* is provided between the third shield 43 and a part of the first shield 41. The second insulating portion 31*b* is provided between another part of the third shield 43 and the second shield 42. The third insulating portion 31*c* is provided between a part of the fourth shield 44 and the first shield 41. The fourth insulating portion 31*d* is provided between another part of the fourth shield 44 and the second shield 42.

The insulating member 31 may include a fifth insulating portion 31*e*, a sixth insulating portion 31*f*, a seventh insulating portion 31*g*, and an eighth insulating portion 31*h*. The fifth insulating portion 31*e* is provided between a part of the first shield 41 and the first magnetic member 11. The sixth insulating portion 31*f* is provided between another part of the first shield 41 and the first magnetic member 11. The seventh insulating portion 31*g* is provided between a part of the second shield 42 and the first magnetic member 11. The eighth insulating portion 31*h* is provided between another part of the second shield 42 and the first magnetic member 11.

The first conductive member 21 may be provided between the fifth insulating portion 31*e* and the sixth insulating portion 31*f*. The second conductive member 22 may be provided between the seventh insulating portion 31*g* and the eighth insulating portion 31*h*.

Figure 4A:
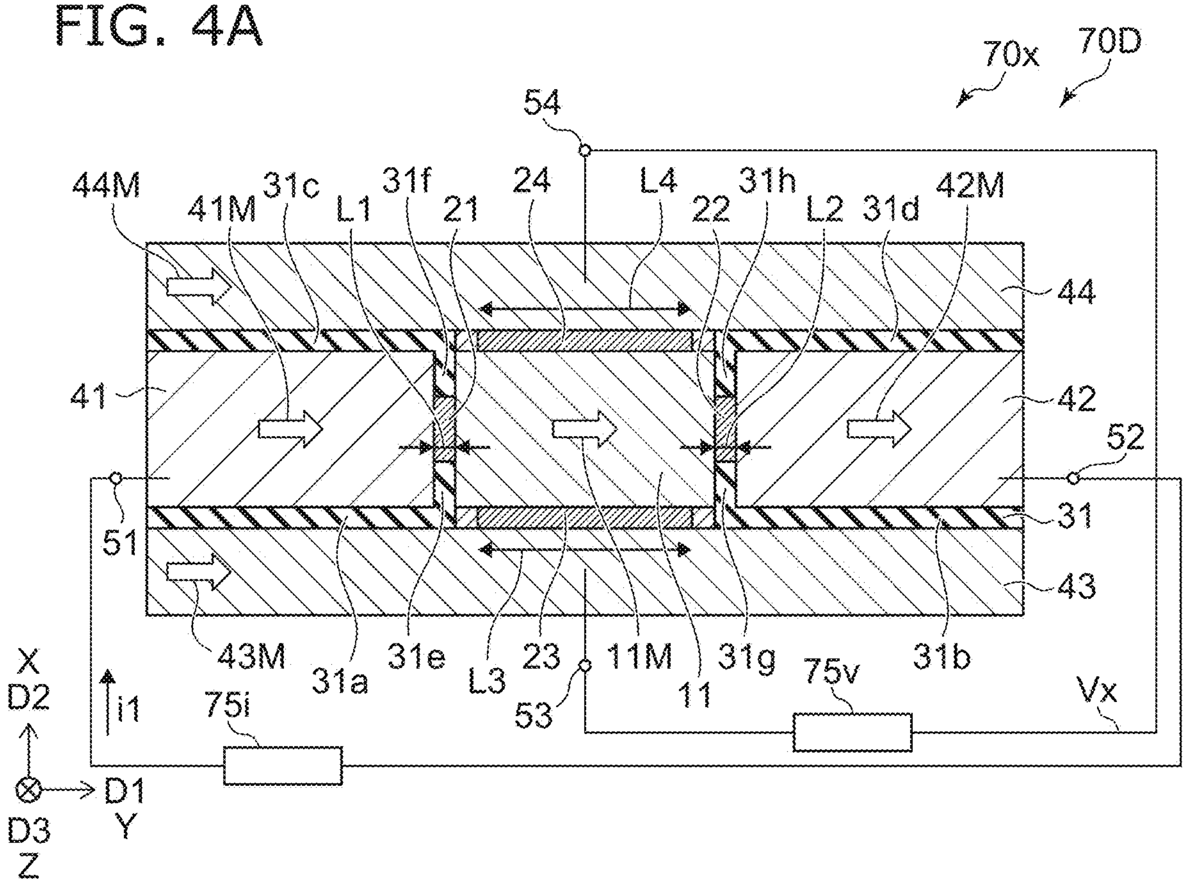
FIGS. 4A and 4B are schematic cross-sectional views illustrating a magnetic sensor according to the first embodiment.
Figure 4B:
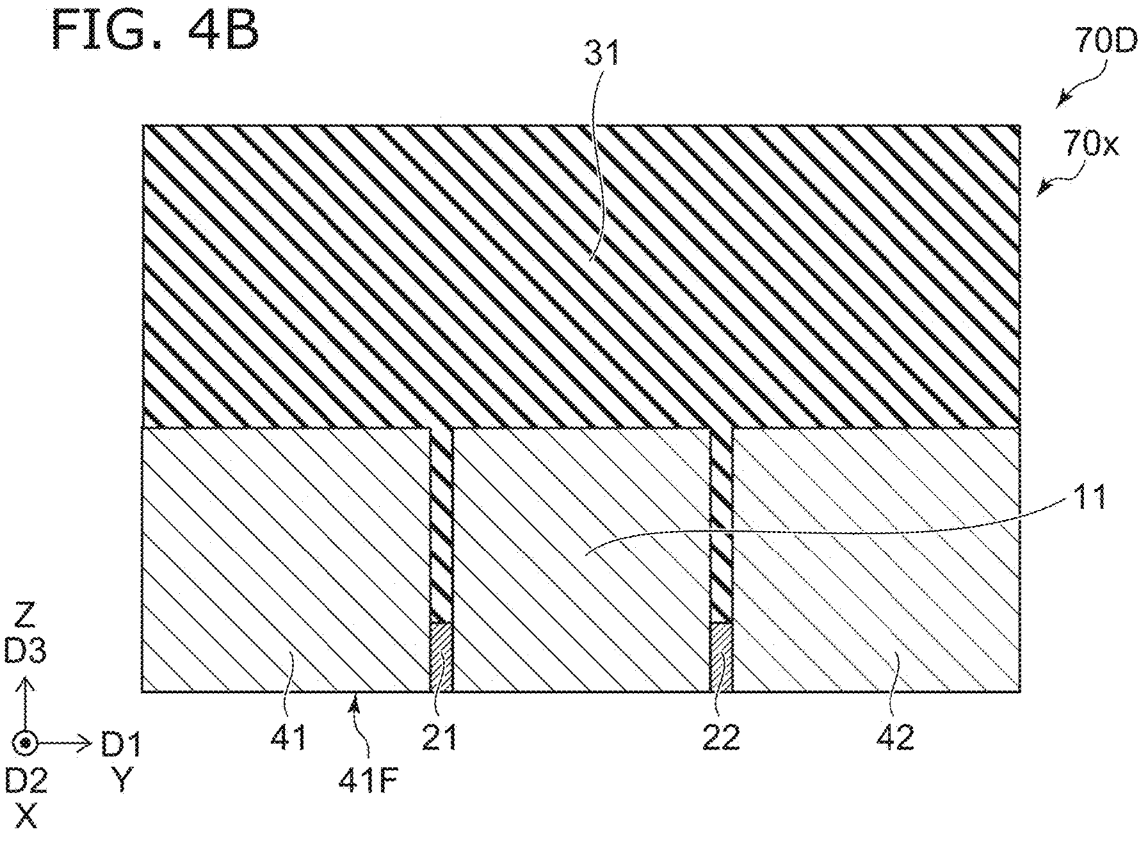

FIGS. 4A and 4B are schematic cross-sectional views illustrating a magnetic sensor according to the first embodiment.

As shown in FIG. 4A, in a magnetic sensor 70D according to the embodiment, the voltage detection circuit 75*v* is connected between the third terminal 53 and the fourth terminal 54, and the current supply circuit 75*i* is connected between the first terminal 51 and the second terminal 52. Except for this, the configuration of the magnetic sensor 70D may be the same as the configuration of the magnetic sensor 70C.

In the magnetic sensor 70D, by applying one of the first material and the second material, a large signal (voltage Vx) is obtained. In the magnetic sensor 70D, the first to fourth configurations may be applied.

In the magnetic sensor 70D, the detection section 70*x* may be configured such that the voltage Vx between the third terminal 53 and the fourth terminal 54 when a first current i1 flows between the first terminal 51 and the second terminal 52 changes according to the detection target magnetic field.

In the embodiment, in a case where the detection section 70*x* includes the first conductive member 21, the second conductive member 22, the third conductive member 23, the fourth conductive member 24, and the fifth conductive member 25, the first conductive member 21, the second conductive member 22, the third conductive member 23, and the fourth conductive member 24 may not satisfy any of the above first to fourth conditions. In this case, the fifth conductive member 25 includes one of the first material and the second material. The first material includes at least one selected from the group consisting of Nb, Mo, Tc, Ta, W, and Re. The second material includes at least one selected from the group consisting of Ru, Rh, Pd, Os, Ir, and Pt.

In the embodiment, at least one of the first conductive member 21, the second conductive member 22, the third conductive member 23, or the fourth conductive member 24 may include Bi. This results in a spin Hall angle with a large absolute value. A large signal (voltage Vx) is obtained. In Bi, the spin Hall angle may be positive or negative. At least one of the first conductive member 21, the second conductive member 22, the third conductive member 23, or the fourth conductive member 24 may further include Sb in addition to Bi. At least one of these conductive members may include a compound including Bi and Sb. A large spin Hall angle is obtained.

Second Embodiment

Figure 5:
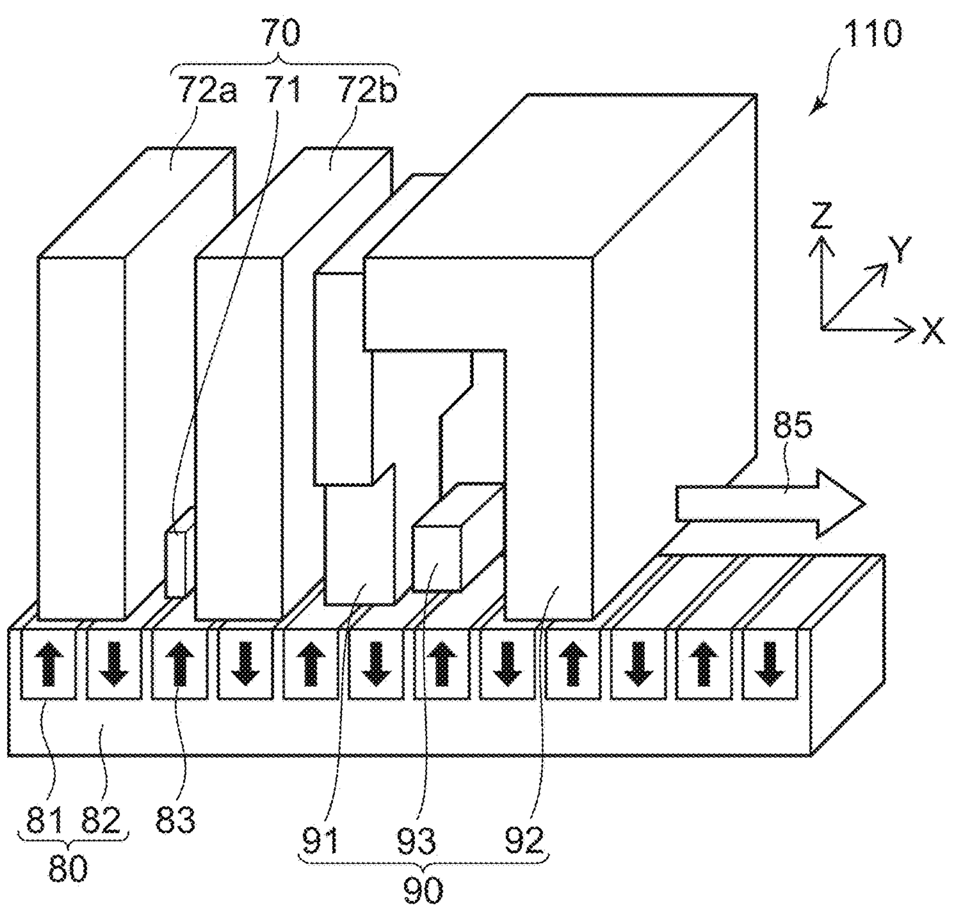
FIG. 5 is a schematic perspective view illustrating a magnetic head and a magnetic recording device according to a second embodiment.

FIG. 5 is a schematic perspective view illustrating a magnetic head and a magnetic recording device according to a second embodiment.

As shown in FIG. 5, a magnetic head 110 according to the embodiment includes a reproducing section 70. The reproducing section 70 includes the magnetic sensor according to the first embodiment (magnetic sensor 70A, magnetic sensor 70B, magnetic sensor 70C, or magnetic sensor 70D). The magnetic head 110 is used together with a magnetic recording medium 80. In this example, the magnetic head 110 includes a recording section 90. The recording section 90 of the magnetic head 110 records information on the magnetic recording medium 80. The reproducing section 70 reproduces the information recorded on the magnetic recording medium 80.

The magnetic recording medium 80 includes, for example, a medium substrate 82 and a magnetic recording layer 81 provided on the medium substrate 82. The magnetization 83 of the magnetic recording layer 81 is controlled by the recording section 90. The recording section 90 includes, for example, a first magnetic pole 91 and a second magnetic pole 92. The first magnetic pole 91 is, for example, a main magnetic pole. The second magnetic pole 92 is, for example, a trailing shield. The recording section 90 may include a recording section element 93. The recording section element 93 may include a magnetic field control element or a high-frequency oscillation element. The recording section element 93 may be omitted.

The reproducing section 70 includes, for example, a first reproducing magnetic shield 72*a*, a second reproducing magnetic shield 72*b*, and a magnetic reproducing element 71. The magnetic reproducing element 71 is provided between the first reproducing magnetic shield 72*a* and the second reproducing magnetic shield 72*b*. The magnetic reproducing element 71 can output a signal corresponding to the magnetization 83 of the magnetic recording layer 81.

When magnetic sensor 70A or magnetic sensor 70B is applied to magnetic head 110, the first reproducing magnetic shield 72*a* corresponds, for example, to one of first shield 41 and second shield 42, and second reproducing magnetic shield 72*b* corresponds, for example, to the other of first shield 41 and second shield 42.

When the magnetic sensor 70C or the magnetic sensor 70D is applied to the magnetic head 110, the first reproducing magnetic shield 72*a* corresponds to, for example, one of the third shield 43 and the fourth shield 44, and the second reproducing magnetic shield 72*b* corresponds to, for example, the other of the third shield 43 and the fourth shield 44. The magnetic reproducing element 71 includes the first magnetic member 11.

As shown in FIG. 5, the magnetic recording medium 80 moves relative to the magnetic head 110 in the medium movement direction 85. The magnetic head 110 controls information corresponding to the magnetization 83 of the magnetic recording layer 81 at arbitrary position. The magnetic head 110 reproduces information corresponding to the magnetization 83 of the magnetic recording layer 81 at arbitrary position. The detection target magnetic field described in relation to the first embodiment, is based on the magnetization 83 of the magnetic recording medium 80.

Figure 6:
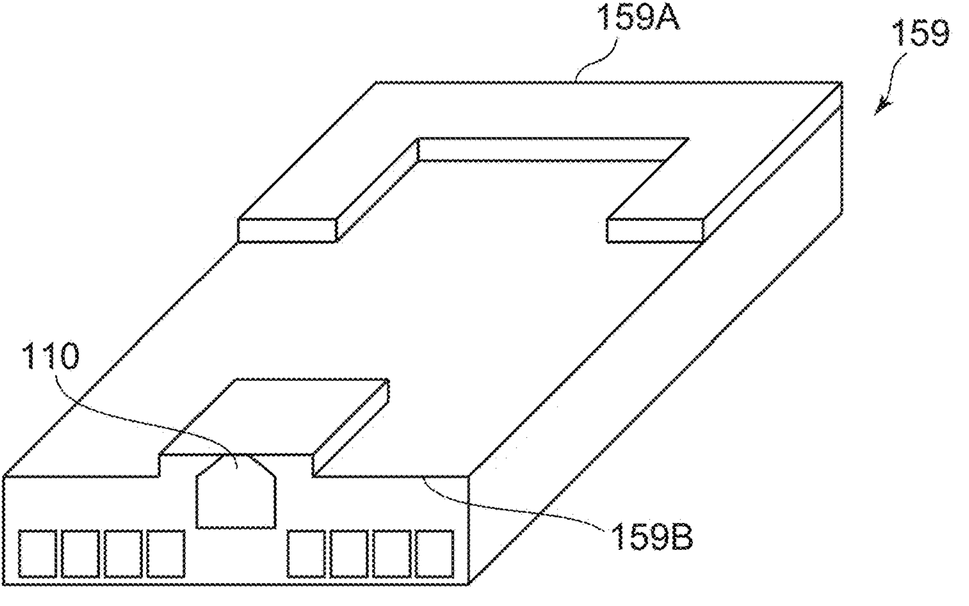
FIG. 6 is a schematic perspective view illustrating a part of the magnetic recording device according to the embodiment.

FIG. 6 is a schematic perspective view illustrating a part of the magnetic recording device according to the embodiment.

FIG. 6 illustrates a head slider.

The magnetic head 110 is provided on the head slider 159. The head slider 159 includes, for example, $Al_2O_3$/TiC or the like. The head slider 159 moves relative to the magnetic recording medium while floating or in contact with the magnetic recording medium.

The head slider 159 includes, for example, an air inflow side 159A and an air outflow side 159B. The magnetic head 110 is arranged on the side face of the air outflow side 159B of the head slider 159 or the like. As a result, the magnetic head 110 moves relative to the magnetic recording medium while flying above or in contact with the magnetic recording medium.

Figure 7:
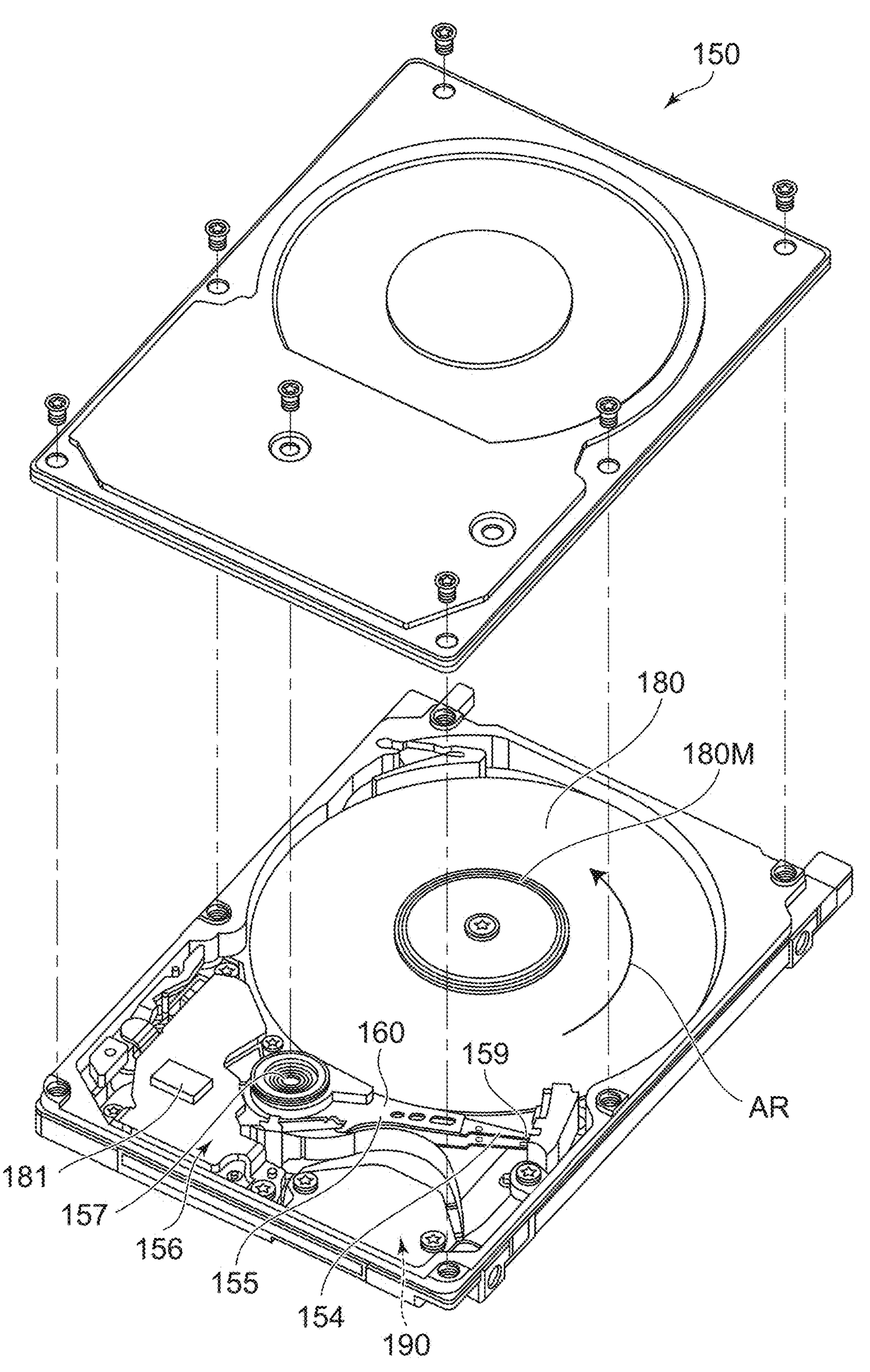
FIG. 7 is a schematic perspective view illustrating the magnetic recording device according to the embodiment.

FIG. 7 is a schematic perspective view illustrating the magnetic recording device according to the embodiment.

As shown in FIG. 7, in a magnetic recording device 150 according to the embodiment, a rotary actuator is used. The recording medium disk 180 is connected to a spindle motor 180M. The recording medium disk 180 is rotated in a direction of arrow AR by the spindle motor 180M. The spindle motor 180M is responsive to control signals from the drive device controller. The magnetic recording device 150 according to the embodiment may include the plurality of recording medium disks 180. The magnetic recording device 150 may include a recording medium 181. The recording medium 181 is, for example, an SSD (Solid State Drive). A non-volatile memory such as a flash memory is used for the recording medium 181, for example. For example, the magnetic recording device 150 may be a hybrid HDD (Hard Disk Drive).

The head slider 159 records and reproduces information to be recorded on the recording medium disk 180. The head slider 159 is provided at an end of a thin-film suspension 154. A magnetic head according to the embodiment is provided near the end of the head slider 159.

While the recording medium disk 180 is rotating, the pressing pressure by the suspension 154 and the floating pressure generated at the medium facing face (ABS) of the head slider 159 are balanced. The distance between the medium facing face of the head slider 159 and the face of the recording medium disk 180 is the predetermined fly height. In the embodiment, the head slider 159 may contact the recording medium disk 180. For example, a contact sliding type may be applied.

The suspension 154 is connected to one end of an arm 155 (e.g., an actuator arm). The arm 155 includes, for example, a bobbin part or the like. The bobbin part holds a drive coil. A voice coil motor 156 is provided at the other end of the arm 155. The voice coil motor 156 is a type of linear motor. The voice coil motor 156 includes, for example, a drive coil and a magnetic circuit. The drive coil is wound on the bobbin part of the arm 155. The magnetic circuit includes permanent magnets and opposing yokes. The drive coil is provided between the permanent magnet and the opposing yoke. The suspension 154 includes one end and the other end. The magnetic head is provided at one end of the suspension 154. The arm 155 is connected to the other end of the suspension 154.

The arm 155 is held by ball bearings. Ball bearings are provided at two locations above and below a bearing part 157. The arm 155 can be rotated and slid by the voice coil motor 156. The magnetic head can move to any position on the recording medium disk 180.

Figure 8A:
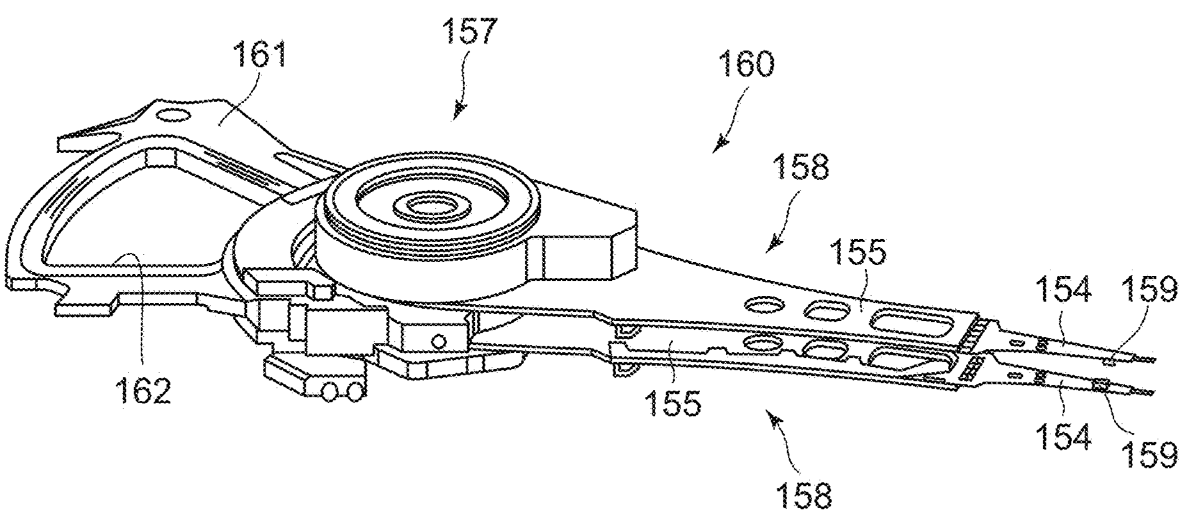
FIGS. 8A and 8B are schematic perspective views illustrating a part of the magnetic recording device according to the embodiment.
Figure 8B:
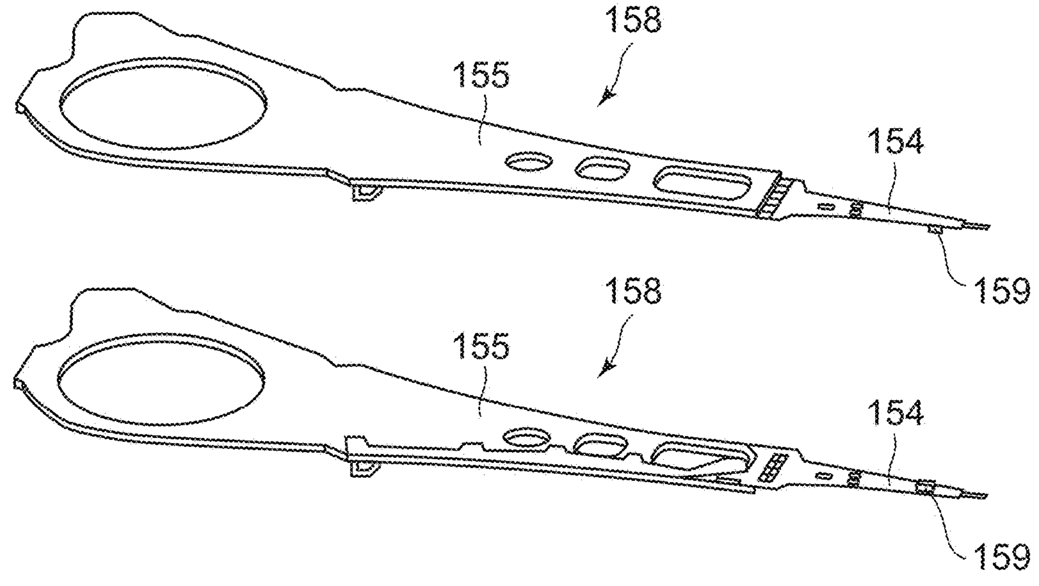

FIGS. 8A and 8B are schematic perspective views illustrating a part of the magnetic recording device according to the embodiment.

FIG. 8A is an enlarged perspective view of the head stack assembly 160, illustrating the configuration of a part of the magnetic recording device.

FIG. 8B is a perspective view illustrating the magnetic head assembly (head gimbal assembly: HGA) 158 that forms part of the head stack assembly 160.

As shown in FIG. 8A, the head stack assembly 160 includes the bearing part 157, the magnetic head assembly 158 and a support frame 161. The magnetic head assembly 158 extends from the bearing part 157. The support frame 161 extends from the bearing part 157. A direction in which the support frame 161 extends is opposite to a direction in which the magnetic head assembly 158 extends. The support frame 161 supports a coil 162 of the voice coil motor 156.

As shown in FIG. 8B, the magnetic head assembly 158 includes the arm 155 extending from the bearing part 157 and the suspension 154 extending from the arm 155.

The head slider 159 is provided at the end of the suspension 154. The head slider 159 is provided with the magnetic head according to the embodiment.

The magnetic head assembly 158 (head gimbal assembly) according to the embodiment includes the magnetic head according to the embodiment, the head slider 159 provided with the magnetic head, the suspension 154 and the arm 155. The head slider 159 is provided at one end of the suspension 154. The arm 155 is connected to the other end of the suspension 154.

The suspension 154 may include, for example, a wiring (not shown) for recording and reproducing signals. The suspension 154 may include, for example, a heater wiring (not shown) for adjusting the fly height. The suspension 154 may include a wiring (not shown) for, for example, an oscillator element or the like. These wires may be electrically connected to plurality of electrodes provided on the magnetic head.

A signal processor 190 is provided in the magnetic recording device 150. The signal processor 190 uses a magnetic head to record and reproduce signals on a magnetic recording medium. Input/output lines of the signal processor 190 are connected to, for example, electrode pads of the magnetic head assembly 158 and electrically connected to the magnetic head.

The magnetic recording device 150 according to the embodiment includes the magnetic recording medium, the magnetic head according to the embodiment, a movable part, a position controller, and a signal processor. The movable part separates the magnetic recording medium from the magnetic head or makes them relatively movable while they are in contact with each other. The position controller aligns the magnetic head with a predetermined recording position on the magnetic recording medium. The signal processor records and reproduces signals on the magnetic recording medium using the magnetic head.

For example, the recording medium disk 180 is used as the above magnetic recording medium. The movable part includes, for example, the head slider 159. The position controller described above includes, for example, the magnetic head assembly 158.

The embodiments may include the following Technical proposals:

Technical Proposal 1

A magnetic sensor, comprising:

a reproducing section, the reproducing section including:

a first shield;

a second shield;

a third shield;

a fourth shield, a second direction from the third shield to the fourth shield crossing a first direction from the first shield to the second shield;

a first magnetic member provided between the first shield and the second shield and between the third shield and the fourth shield;

a first conductive member provided between the first shield and the first magnetic member, the first conductive member being non-magnetic;

a second conductive member provided between the second shield and the first magnetic member, the second conductive member being non-magnetic;

a third conductive member provided between the third shield and the first magnetic member, the third conductive member being non-magnetic; and a fourth conductive member provided between the fourth shield and the first magnetic member, the fourth conductive member being non-magnetic, the first conductive member, the second conductive member, the third conductive member, and the fourth conductive member satisfying one of a first condition, a second condition, a third condition, and a fourth condition, in the first condition, one of the first conductive member, the second conductive member, the third conductive member, and the fourth conductive member including one of a first material and a second material, and other three of the first conductive member, the second conductive member, the third conductive member, and the fourth conductive member including a third material, in the second condition, the first conductive member and the second conductive member including the one of the first material and the second material, and the third conductive member and the fourth conductive member including the third material, in the third condition, the third conductive member and the fourth conductive member including the one of the first material and the second material, and the first conductive member and the second conductive member including the third material, in the fourth condition, three of the first conductive member, the second conductive member, the third conductive member, and the fourth conductive member including the one of the first material and the second material, and other one of the first conductive member, the second conductive member, the third conductive member, and the fourth conductive member including the third material, the first material including at least one selected from the group consisting of Nb, Mo, Tc, Ta, W, and Re, the second material including at least one selected from the group consisting of Ru, Rh, Pd, Os, Ir, and Pt, and the third material including at least one selected from the group consisting of Cu, Al, Tb, and Cr.

Technical Proposal 2

The magnetic sensor according to Technical proposal 1, wherein the first magnetic member includes at least one selected from the group consisting of Fe, Co, and Ni.

Technical Proposal 3

The magnetic sensor according to Technical proposal 2, wherein the first magnetic member further includes B.

Technical Proposal 4

The magnetic sensor according to Technical proposal 1, wherein the first magnetic member includes at least one selected from the group consisting of $Co_2MnGa$, $Co_2MnAl$, FePt, MnGa, $Mn_3Sn$, $Mn_3Ge$, $Mn_3Ga$, $RuO_2$, MnTe, CrSb, and $Mn_5Si_3$.

Technical Proposal 5

The magnetic sensor according to Technical proposal 4, wherein the first magnetic member has an anomalous Hall effect.

Technical Proposal 6

The magnetic sensor according to any one of Technical proposals 1-5, wherein the detection section further includes a fifth conductive member being non-magnetic the first shield includes a first end face, a direction from the first magnetic member to the fifth conductive member is along a third direction crossing a plane including the first direction and the second direction, a first position of at least a part of the first magnetic member in the third direction is between a first end face position of the first end face in the third direction and a fifth conductive member position of the fifth conductive member in the third direction.

Technical Proposal 7

The magnetic sensor according to Technical proposal 6, wherein the fifth conductive member includes the one of the first material and the second material.

Technical Proposal 8

A magnetic sensor, comprising:

a reproducing section, the reproducing section including:

a first shield;

a second shield;

a third shield;

a fourth shield, a second direction from the third shield to the fourth shield crossing a first direction from the first shield to the second shield;

a first magnetic member provided between the first shield and the second shield and between the third shield and the fourth shield;

a first conductive member provided between the first shield and the first magnetic member, the first conductive member being non-magnetic;

a second conductive member provided between the second shield and the first magnetic member, the second conductive member being non-magnetic;

a third conductive member provided between the third shield and the first magnetic member, the third conductive member being non-magnetic;

a fourth conductive member provided between the fourth shield and the first magnetic member, the fourth conductive member being non-magnetic; and a fifth conductive member being non-magnetic:

the first shield including a first end face, a direction from the first magnetic member to the fifth conductive member being along a third direction crossing a plane including the first direction and the second direction, a first position of at least a part of the first magnetic member in the third direction being between a first end face position of the first end face in the third direction and a fifth conductive member position of the fifth conductive member in the third direction.

Technical Proposal 9

The magnetic sensor according to Technical proposal 8, wherein the fifth conductive member includes one of a first material and a second material, the first material includes at least one selected from the group consisting of Nb, Mo, Tc, Ta, W, and Re, and the second material includes at least one selected from the group consisting of Ru, Rh, Pd, Os, Ir, and Pt.

Technical Proposal 10

A magnetic sensor, comprising:

a reproducing section, the reproducing section including:

a first shield;

a second shield;

a third shield;

a fourth shield, a second direction from the third shield to the fourth shield crossing a first direction from the first shield to the second shield;

a first magnetic member provided between the first shield and the second shield and between the third shield and the fourth shield;

a first conductive member provided between the first shield and the first magnetic member, the first conductive member being non-magnetic;

a second conductive member provided between the second shield and the first magnetic member, the second conductive member being non-magnetic;

a third conductive member provided between the third shield and the first magnetic member, the third conductive member being non-magnetic; and a fourth conductive member provided between the fourth shield and the first magnetic member, the fourth conductive member being non-magnetic, the first magnetic member including at least one selected from the group consisting of Fe, Co, and Ni, the first conductive member, the second conductive member, the third conductive member, and the fourth conductive member including one of a first material and a second material, the first material including at least one selected from the group consisting of Nb, Mo, Tc, Ta, W, and Re, and the second material including at least one selected from the group consisting of Ru, Rh, Pd, Os, Ir, and Pt.

Technical Proposal 11

The magnetic sensor according to Technical proposal 10, wherein the first magnetic member further includes B.

Technical Proposal 12

The magnetic sensor according to any one of Technical proposals 1-11, wherein the third shield is provided between a part of the first shield and a part of the second shield in the first direction, and the fourth shield is provided between another part of the first shield and another part of the second shield in the first direction.

Technical Proposal 13

The magnetic sensor according to Technical proposal 12, wherein a first conductive member length along the first direction is 4 nm or more.

Technical Proposal 14

The magnetic sensor according to any one of Technical proposals 1-11, wherein the first shield is provided between a part of the third shield and a part of the fourth shield in the first direction, and the second shield is provided between another part of the third shield and another part of the fourth shield in the first direction.

Technical Proposal 15

The magnetic sensor according to Technical proposal 14, wherein a third conductive member length of the third conductive member along the first direction is 4 nm or more.

Technical Proposal 16

The magnetic sensor according to any one of Technical proposals 1-15, further comprising:

a first terminal electrically connected to the first shield;

a second terminal electrically connected to the second shield;

a third terminal electrically connected to the third shield; and a fourth terminal electrically connected to the fourth shield.

Technical Proposal 17

The magnetic sensor according to Technical proposal 16, wherein the detection section being configured such that a voltage between the first terminal and the second terminal when a first current flows between the third terminal and the fourth terminal changes according to a detection target magnetic field.

Technical Proposal 18

The magnetic sensor according to Technical proposal 16, wherein the detection section is configured such that a voltage between the third terminal and the fourth terminal when a first current flows between the first terminal and the second terminal changes according to a detection target magnetic field.

Technical Proposal 19

A magnetic head, comprising:

the magnetic sensor according to Technical proposal 17 or 18, and the detection target magnetic field is based on a magnetization of a magnetic recording medium.

Technical Proposal 20

A magnetic recording device, comprising:

the magnetic head according to Technical proposal 19; and the magnetic recording medium.

According to the embodiment, it is possible to provide a magnetic sensor, a magnetic head, and a magnetic recording device that can improve the characteristics.

In the specification of the application, “perpendicular” and “parallel” refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic sensors, magnetic heads and magnetic recording devices such as shields, magnetic members, conductive members, terminals, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic sensors, all magnetic heads and magnetic recording devices practicable by an appropriate design modification by one skilled in the art based on the magnetic sensors, the magnetic heads and the magnetic recording devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic sensor, comprising:
a detection section,
the detection section including:
a first shield;
a second shield;
a third shield;
a fourth shield, a second direction from the third shield to the fourth shield crossing a first direction from the first shield to the second shield;
a first magnetic member provided between the first shield and the second shield and between the third shield and the fourth shield;
a first conductive member provided between the first shield and the first magnetic member, the first conductive member being non-magnetic;
a second conductive member provided between the second shield and the first magnetic member, the second conductive member being non-magnetic;
a third conductive member provided between the third shield and the first magnetic member, the third conductive member being non-magnetic; and
a fourth conductive member provided between the fourth shield and the first magnetic member, the fourth conductive member being non-magnetic,
the first conductive member, the second conductive member, the third conductive member, and the fourth conductive member satisfying one of a first condition, a second condition, a third condition, and a fourth condition,
in the first condition, one of the first conductive member, the second conductive member, the third conductive member, and the fourth conductive member including one of a first material and a second material, and other three of the first conductive member, the second conductive member, the third conductive member, and the fourth conductive member including a third material,
in the second condition, the first conductive member and the second conductive member including the one of the first material and the second material, and the third conductive member and the fourth conductive member including the third material,
in the third condition, the third conductive member and the fourth conductive member including the one of the first material and the second material, and the first conductive member and the second conductive member including the third material,
in the fourth condition, three of the first conductive member, the second conductive member, the third conductive member, and the fourth conductive member including the one of the first material and the second material, and other one of the first conductive member, the second conductive member, the third conductive member, and the fourth conductive member including the third material,
the first material including at least one selected from the group consisting of Nb, Mo, Tc, Ta, W, and Re,
the second material including at least one selected from the group consisting of Ru, Rh, Pd, Os, Ir, and Pt, and
the third material including at least one selected from the group consisting of Cu, Al, Tb, and Cr.

2. The magnetic sensor according to claim 1, wherein
the first magnetic member includes at least one selected from the group consisting of Fe, Co, and Ni.

3. The magnetic sensor according to claim 2, wherein
the first magnetic member further includes B.

4. The magnetic sensor according to claim 1, wherein
the first magnetic member includes at least one selected from the group consisting of $Co_2MnGa$, $Co_2MnAl$, FePt, MnGa, $Mn_3Sn$, $Mn_3Ge$, $Mn_3Ga$, $RuO_2$, MnTe, CrSb, and $Mn_5Si_3$.

5. The magnetic sensor according to claim 4, wherein
the first magnetic member has an anomalous Hall effect.

6. The magnetic sensor according to claim 1, wherein
the detection section further includes a fifth conductive member being non-magnetic
the first shield includes a first end face,
a direction from the first magnetic member to the fifth conductive member is along a third direction crossing a plane including the first direction and the second direction,
a first position of at least a part of the first magnetic member in the third direction is between a first end face position of the first end face in the third direction and a fifth conductive member position of the fifth conductive member in the third direction.

7. The magnetic sensor according to claim 6, wherein
the fifth conductive member includes the one of the first material and the second material.

8. A magnetic sensor, comprising:
a detection section,
the detection section including:
a first shield;
a second shield;
a third shield;
a fourth shield, a second direction from the third shield to the fourth shield crossing a first direction from the first shield to the second shield;
a first magnetic member provided between the first shield and the second shield and between the third shield and the fourth shield;
a first conductive member provided between the first shield and the first magnetic member, the first conductive member being non-magnetic;
a second conductive member provided between the second shield and the first magnetic member, the second conductive member being non-magnetic;
a third conductive member provided between the third shield and the first magnetic member, the third conductive member being non-magnetic;
a fourth conductive member provided between the fourth shield and the first magnetic member, the fourth conductive member being non-magnetic; and
a fifth conductive member being non-magnetic:
the first shield including a first end face,
a direction from the first magnetic member to the fifth conductive member being along a third direction crossing a plane including the first direction and the second direction,
a first position of at least a part of the first magnetic member in the third direction being between a first end face position of the first end face in the third direction and a fifth conductive member position of the fifth conductive member in the third direction.

9. The magnetic sensor according to claim 8, wherein
the fifth conductive member includes one of a first material and a second material,
the first material includes at least one selected from the group consisting of Nb, Mo, Tc, Ta, W, and Re, and
the second material includes at least one selected from the group consisting of Ru, Rh, Pd, Os, Ir, and Pt.

10. A magnetic sensor, comprising:

a detection section, the detection section including:

a first shield;

a second shield;

a third shield;

a fourth shield, a second direction from the third shield to the fourth shield crossing a first direction from the first shield to the second shield;

a first magnetic member provided between the first shield and the second shield and between the third shield and the fourth shield;

a first conductive member provided between the first shield and the first magnetic member, the first conductive member being non-magnetic;

a second conductive member provided between the second shield and the first magnetic member, the second conductive member being non-magnetic;

a third conductive member provided between the third shield and the first magnetic member, the third conductive member being non-magnetic; and a fourth conductive member provided between the fourth shield and the first magnetic member, the fourth conductive member being non-magnetic, the first magnetic member including at least one selected from the group consisting of Fe, Co, and Ni, the first conductive member, the second conductive member, the third conductive member, and the fourth conductive member including one of a first material and a second material, the first material including at least one selected from the group consisting of Nb, Mo, Tc, Ta, W, and Re, and the second material including at least one selected from the group consisting of Ru, Rh, Pd, Os, Ir, and Pt.

11. The magnetic sensor according to claim 10, wherein the first magnetic member further includes B.

12. The magnetic sensor according to claim 1, wherein the third shield is provided between a part of the first shield and a part of the second shield in the first direction, and the fourth shield is provided between another part of the first shield and another part of the second shield in the first direction.

13. The magnetic sensor according to claim 12, wherein a first conductive member length along the first direction is 4 nm or more.

14. The magnetic sensor according to claim 1, wherein the first shield is provided between a part of the third shield and a part of the fourth shield in the first direction, and the second shield is provided between another part of the third shield and another part of the fourth shield in the first direction.

15. The magnetic sensor according to claim 14, wherein a third conductive member length of the third conductive member along the first direction is 4 nm or more.

16. The magnetic sensor according to claim 1, further comprising:

a first terminal electrically connected to the first shield;

a second terminal electrically connected to the second shield;

a third terminal electrically connected to the third shield; and a fourth terminal electrically connected to the fourth shield.

17. The magnetic sensor according to claim 16, wherein the detection section being configured such that a voltage between the first terminal and the second terminal when a first current flows between the third terminal and the fourth terminal changes according to a detection target magnetic field.

18. The magnetic sensor according to claim 16, wherein the detection section is configured such that a voltage between the third terminal and the fourth terminal when a first current flows between the first terminal and the second terminal changes according to a detection target magnetic field.

19. A magnetic head, comprising:

the magnetic sensor according to claim 17, and the detection target magnetic field is based on a magnetization of a magnetic recording medium.

20. A magnetic recording device, comprising:

the magnetic head according to claim 19; and the magnetic recording medium.

* * * * *